United States Patent [19]

Iida et al.

[11] Patent Number: 4,675,469
[45] Date of Patent: Jun. 23, 1987

[54] AMORPHOUS SILICON SOLAR BATTERY

[75] Inventors: Hideyo Iida, Takasaki; Toshio Mishuku, Yoshiimachi; Nobuyasu Shiba, Takasaki, all of Japan

[73] Assignee: Taiyo Yuden Kabushiki Kaisha, Tokyo, Japan

[21] Appl. No.: 823,589

[22] Filed: Jan. 29, 1986

Related U.S. Application Data

[63] Continuation-in-part of Ser. No. 637,424, Aug. 3, 1984, abandoned.

[30] Foreign Application Priority Data

Aug. 5, 1983 [JP] Japan ................ 58-142556

[51] Int. Cl.⁴ .............................. H01L 31/06
[52] U.S. Cl. .................... 136/259; 136/256; 136/258; 357/30; 357/59; 357/65; 357/71
[58] Field of Search ............ 136/256, 258 AM, 259; 357/2, 30, 59 C, 65, 71

[56] References Cited

U.S. PATENT DOCUMENTS 4,442,310 4/1984 Carlson et al. ............ 136/256
4,500,743 2/1985 Hayashi et al. ............ 136/258

OTHER PUBLICATIONS

H. Iida et al., *IEEE Electron Device Letters*, vol. ED-L-4, May 1983, pp. 157-159.
H. W. Deckman et al., *J. Vac. Sci. Technol.*, vol. A1 (2), Apr.-Jun. 1983, pp. 578-582.

*Primary Examiner*—Aaron Weisstuch
*Attorney, Agent, or Firm*—Michael N. Meller

[57] ABSTRACT

An amorphous silicon solar battery is formed by applying a sequence of layers on a transparent substrate, preferably of glass. A transparent electrode film of conductive material is applied on the substrate, followed by an amorphous silicon semi-conductor, which is in turn followed by a back electrode film of transparent conductive film. In addition, a metallic film may be formed on the back electrode. The surface roughness of the first transparent conductive film is such that the average grain diameter is in the range of 0.1-0.9 micron. Impinging light rays are refracted at random by this uneven surface. The result is an increase in the current density of the solar battery, due to the increased optical paths of the light rays through the semi-conductor material and the increased reflection effect at the second transparent conductive film.

7 Claims, 11 Drawing Figures

AMORPHOUS SILICON SOLAR BATTERY

CROSS-REFERENCE TO RELATED APPLICATION

This application is a continuation-in-part application of Ser. No. 637,424, filed Aug. 3, 1984, and now abandoned.

BACKGROUND OF THE INVENTION

Field of the Invention

This invention relates to an amorphous silicon solar battery possessing a high short-circuit current density.

A solar battery of this type in the known prior art comprises a flat substrate of glass or the like having a transparent electrode selected from indium oxide, indium tin oxide, tin oxide or the like formed thereon; an amorphous silicon semi-conductor layer comprising semi-conductor p-i-n layers formed on the transparent electrode; an indium tin oxide film in turn formed on the amorphous silicon semi-conductor layer for improving the adhesion between the semi-conductor layer; and a back electrode formed on the indium tin oxide film. This back electrode is formed by vapor-depositing a silver reflection film on the indium tin oxide film. This type of solar battery is not quite adequate, however, in that its short-circuit electric current density $J_{sc}$ is as low as 15 mA/cm$^2$, in spite of the use of silver, which has a high reflective index.

A second known solar battery is disclosed in the *Conference Record of the 16th IEEE Photovoltaic Specialists Conference* (1982), by Deckmann et al pp 1425-1426. This solar battery is characterized by texturing the semiconductor with structures having characteristic dimensions nearly equal to the wavelength of visible light within the semiconductor so as to increase the short-circuit current thereof.

Figure 8:
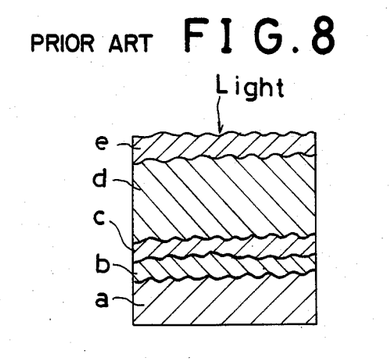
FIG. 8 is a sectional view of part of a conventional amorphous silicon solar battery.

The Deckmann type solar battery may be prepared, for example, in such a manner that, as shown in FIG. 8, a single layer of spherical polyethylene latex of 0.1-0.5 micron in particle size is fixedly formed on the surface of a glass substrate, and the surface of the substrate a, having the latex layer as a mask, is formed into an uneven surface by applying an ion milling treatment to the surface, and thereafter, the uneven surface thus formed is coated with a silver film b to serve as a back electrode, a transparent conductive film c, an amorphous silicon semi-conductor layer d, and a transparent electrode film e, in sequence, in almost the same manner as mentioned above.

This type of solar battery is unsatisfactory, however, in that its short-circuit current density is not significantly improved, in spite of the difficult work entailed in forming the aforementioned uneven surface for causing a reflected ray from the back electrode to be confined in the semi-conductor layer, and there cannot be obtained thereby a high collection efficiency over a wide range of wavelength of a solar light.

In order to improve conventional solar batteries of this type, applicants have previously proposed that a transparent substrate be coated with a transparent electrode having an uneven surface with particles having an average grain diameter of 0.1-2.5 microns, an amorphous silicon semi-conductor layer, and a back electrode of silver, aluminum or the the like, in sequence, whereby there is obtained a solar battery having a slightly improved short-circuit current density, but of only 17 mA/cm$^2$.

In the meanwhile, there has been hitherto known a type of solar battery such as disclosed in U.S. Pat. No. 4,400,577 or U.S. Pat. No. 4,419,533, etc. wherein there is interposed a layer of transparent conductive material such as ITO or SnO$_2$ between the amorphous silicon body and a layer of reflective metal constituting a back electrode. It is, however, defective in that a high short circuit current density cannot be obtained thereby.

SUMMARY OF THE INVENTION

This invention relates to an improvement of the foregoing conventional and previously proposed solar batteries. The object of the invention is to provide a solar battery that has a higher short-circuit current density, related to an increase in the photoelectric conversion efficiency, higher than that achieved by the conventional batteries of this type, over a wider range of the wavelength of the solar light. The solar battery of the present invention includes a transparent substrate which is coated with a transparent electrode, an amorphous silicon semi-conductor layer, and a back electrode, in sequence. The inventive battery is unique in that the transparent electrode comprises a first transparent conductive film having an uneven surface formed of particles with an average grain diameter of 0.1-0.9 micron, and the back electrode comprises at least a second transparent conductive film.

BRIEF DESCRIPTION OF THE DRAWINGS

The solar battery of the present invention will be described hereinbelow in greater detail with reference to the following drawings.

DETAILED DESCRIPTION OF THE PREFERRED EMBODIMENTS

Figure 1:
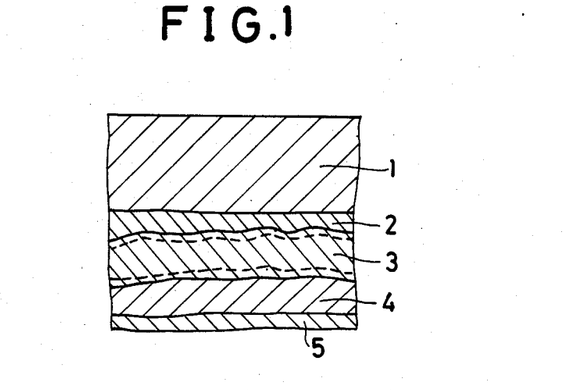
FIG. 1 is a sectional view of part of an amorphous silicon solar battery according to the present invention.

Referring to FIG. 1, a transparent substrate 1 made of glass, for instance, is depicted on the side of ray incidence. A first transparent conductive film 2 is formed on the substrate 1 having an uneven surface formed of particles with an average grain diameter of 0.1-0.9 micron. This first transparent conductive film may be made of tin oxide ($SnO_2$), indium tin oxide (ITO), or the like. An amorphous silicon semi-conductor layer 3 comprising p-i-n layers is formed on conductive film 2. A second transparent conductive film 4 of indium tin oxide, for instance, serving as a back electrode, is in turn formed on semi-conductor layer 3. The conductive film is coated with a metallic film of silver, aluminum, copper, chromium, or the like, as occasion demands, which serves as a back electrode and also acts as a reflection layer.

According to this invention, a light ray which enters the amorphous silicon semi-conductor layer 3 after passing through the transparent substrate 1 and first transparent conductive film 2, is refracted at random at the uneven surface of the first transparent conductive film 2, so that a long optical path length is defined in the amorphous silicon semi-conductor layer 3 which allows the radiant energy to be optimally absorbed in the semiconductor layer 3. In addition, the refracted light rays which reach the back electrode 5 from the semi-conductor layer 3 have a large angle of incidence. Furthermore, the refractive index of the semi-conductor layer 3 is comparatively large, but the refractive index of the second transparent conductive film 4, serving as the back electrode, is comparatively small, so that all of the rays which have an angle of incidence greater than a critical angle are reflected. In this way, a high reflection effect can be obtained at the second transparent conductive film 4. Thus, a short-circuit current density can be obtained which is larger than that in the conventional solar battery having only a back electrode of metal, such as silver or the like.

In addition, if a metallic film 5 of silver, aluminum, copper, chromium, or the like, that can easily form a reflection surface is applied on the outer surface of the second transparent conductive film 4, any penetration of the ray therethrough can be prevented, thereby further increasing the short-circuit current density.

Preferred embodiments of the invention will be described and compared with hereinbelow.

PREFERRED EMBODIMENT I

A first preferred embodiment is made in accordance with the following steps. $SnCl_4.5H_2O$ and $SbCl_3$ are measured so that the percentage of tin is 3% by weight in relation to antimony, and the materials thus measured are dissolved in an aqueous solution of 1% HCl so as to be 10% in concentration. The resultant liquid is sprayed on a glass substrate heated to 430° C. so as to form a tin oxide ($SnO_2$) film having a thickness of 0.8 micron and serving as the first transparent conductive film. The surface of the resultant tin oxide film is observed by an electron photomicrograph taken in a replica process, and the average value of the grain diameter is calculated. It has been found that this tin oxide film has an uneven surface with an average grain diameter of 0.4 micron, and a sheet resistance equal to about 15 ohms. By a plane parallel plate type glow discharge process, an amorphous silicon semi-conductor layer is formed on this tin oxide film so as to comprise a p layer, an i layer, and an n layer, in sequence. The p layer is deposited in a thickness of about 100 Å by an electric discharge power of 0.1 W/cm², in a flow of a gas mixture comprising $SiH_4$ and $B_2H_6$ which is mixed in a ratio of 50:50 by volume. The i layer is deposited in a thickness of about 5000 Å in a flow of $SiH_4$ gas and the n layer is deposited in a thickness of 300 Å in a flow of a gas mixture comprising $SiH_4$ and $PH_3$, which is mixed in a ratio of $SiH_4:PH_3 = 80:20$ by volume. Then, a film of indium tin oxide (ITO) in a thickness of about 700 Å is formed on the amorphous silicon layer by an electron beam vapor deposition process in an oxygen atmosphere of $5 \times 10^{-4}$ Torr. Thus, a solar battery 2 mm × 2 mm in size is produced wherein the back electrode thereof is a second transparent conductive film of indium tin oxide. Additionally, other solar batteries are produced in almost the same manner as above, except that the period of time for forming the first transparent conductive film of tin oxide is varied so that the thickness equals 0.25, 0.5, 0.7, 1.2, and 1.9 microns, respectively, and the average grain diameter of the surface is 0.1, 0.2, 0.3, 0.5 and 0.9 micron, respectively (the sheet resistance equals about 60, 30, 20, 13, and 8 ohms/square, respectively). Each back electrode of these additional solar batteries comprises only the second transparent conductive film of indium tin oxide.

Figure 2:
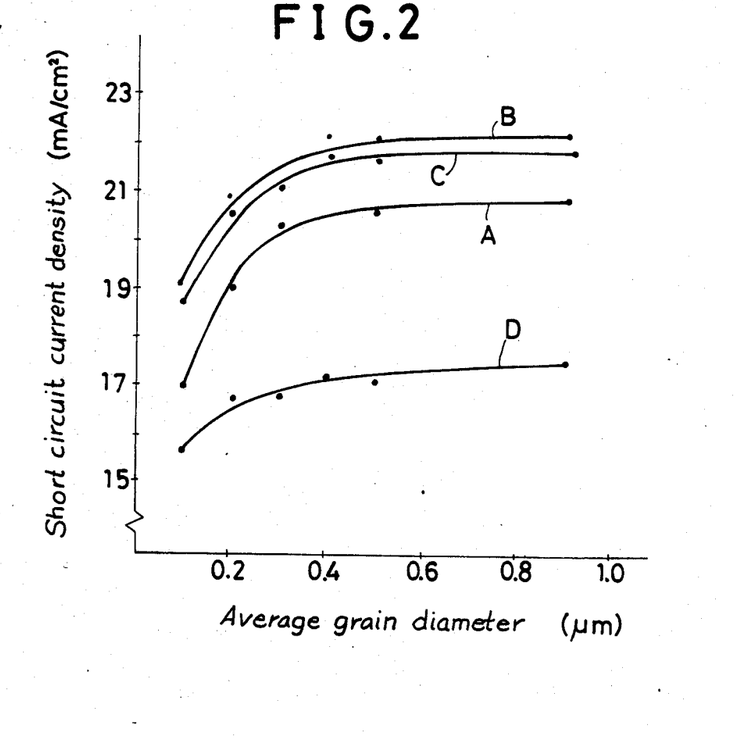
FIG. 2 is a diagram showing the short-circuit current density in relation to the average grain diameter of the first transparent conductive film of preferred embodiments of the present invention (A-C) and of a comparison embodiment (D)

The respective short-circuit current densities $J_{sc}$ of these solar batteries when irradiated by a ray from solar simulator of AM-1 lie in the range of 16.9-21.0 mA/cm², as shown by curve A in FIG. 2.

Figure 3:
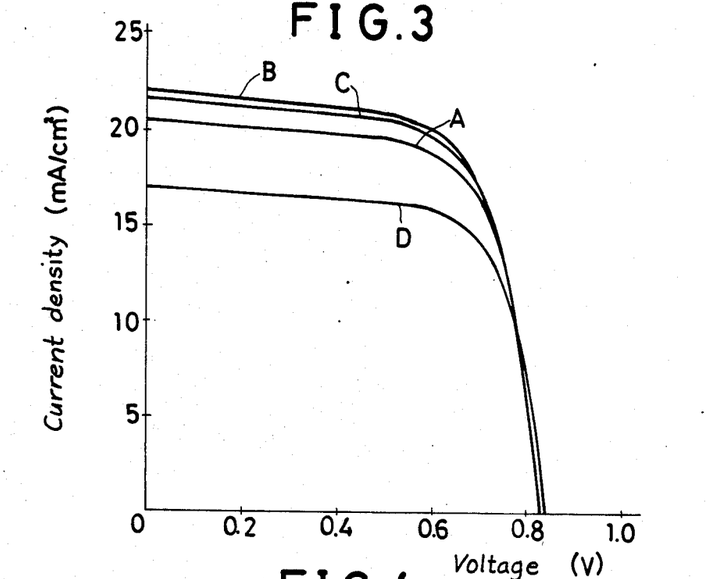
FIG. 3 is a voltage-current density characteristic diagram for the preferred embodiments of the present invention (A-C) and a comparison embodiment (D)

Among the foregoing samples having an average grain diameter in the range of 0.1-0.9 micron, the sample with an average grain diameter of 0.4 micron has the voltage-current density characteristic shown by curve A in FIG. 3. This results in a short-circuit current density $J_{sc}$ equal to 20.5 mA/cm², and open-circuit voltage $V_{oc}$ of 0.84 V, and a conversion efficiency $\eta$ of 11.3%.

PREFERRED EMBODIMENT II

In a manner similar to that used in making the first preferred embodiment, first transparent conductive films ($SnO_2$) having surfaces with average grain diameter of 0.1, 0.2, 0.3, 0.4, 0.5, and 0.9 micron are applied on respective glass substrates, followed by amorphous silicon semi-conductor layers and then second transparent conductive films (ITO), in sequence, to obtain respective samples. Thereafter, a silver film of about 1 micron in thickness is applied on each sample by an electron beam vapor deposition process, whereby solar batteries are produced which are 2 mm × 2 mm in dimension and which have a rear surface electrode comprising respective layers of ITO and silver.

The short-circuit current densities $J_{sc}$ of these solar batteries when irradiated by a ray from a solar simulator of AM-1 at 100 mW/cm² lie in the range of 19.1-22.3 mA/cm², as shown by curve B in FIG. 2.

The voltage-current density characteristic of a solar battery of 0.4 micron average grain diameter is such that $J_{sc} = 22.3$ mA/cm², $V_{oc} = 0.83$ V (as shown by curve B in FIG. 3), and $\eta = 12.1\%$.

PREFERRED EMBODIMENT III

Samples having first transparent conductive films with surfaces of, respectively, 0.1, 0.2, 0.3, 0.4, 0.5, and 0.9 micron average grain diameter are formed in almost the same manner as used for the first preferred embodiment. The second transparent conductive film of each sample is coated with an aluminum film with a thickness of 1 micron by an electron beam vapor deposition treatment, whereby solar batteries are produced which are 2 mm×2 mm in dimension and which have a rear surface electrode comprising respective layers of ITO and aluminum.

The short-circut current densities $J_{sc}$ for these solar batteries lie in the range 18.7–22 mA/cm$^2$, as shown by curve C in FIG. 2. Curve C in FIG. 3 is the voltage-current density characteristic of the sample for which the surface of the first transparent conductive film is 0.4 micron in average grain diameter. For this sample, $J_{sc}=21.88$ mA/cm$^2$, $V_{oc}=0.84$ V, and $\eta=12\%$.

COMPARISON EMBODIMENT I

For the purpose of comparison, samples are made having first transparent conductive films with surfaces of, respectively, 0.1, 0.2, 0.3, 0.4, 0.5, and 0.9 micron average grain diameter and amorphous silicon semiconductor layers formed on respective glass transparent substrates, in sequence, using the same method as for earlier-described embodiments. Thereafter, each sample is coated not with a second transparent conductive film of ITO, but rather with an aluminum film having a thickness of 1 micron by an electron beam vapor deposition treatment; this aluminum film serving as the back electrode. Again, solar batteries with dimensions 2 mm×2 mm are formed, this time with short-circuit current densities $J_{sc}$ in the range 15.6–17.5 mA/cm$^2$, as shown by curve D in FIG. 2. Curve D in FIG. 3 is the voltage-current density characteristic of the sample for which the surface of the first transparent conductive film has an average grain diameter of 0.4 micron. For this sample, $J_{sc}=17.1$ mA/cm$^2$, $V_{oc}=0.84$ V, and $\eta=9.45\%$.

COMPARISON EMBODIMENT II

Again, for the purposes of comparison, a second embodiment was manufactured by first forming a 1500-Å-thick ITO film, by electron beam vapor deposition, on a glass substrate heated to 250° C. in an oxygen atmosphere of 10$^{-4}$ Torr, while using a block of 95 mol.% In$_2$O$_3$ and 5 mol.% SnO$_2$ as a supply source. Additionally, a 500-Å-thick SnO$_2$ film is formed thereon in a manner similar to that used with the first preferred embodiment. This first transparent conductive film has an average grain diameter of 0.04 micron on its surface, and thus is substantially flat, and has a sheet resistance of 15 ohms/square.

In a manner similar to that used for the first preferred embodiment, an amorphous silicon semi-conductor layer comprising p, i, and n layers is formed on the first transparent conductive film.

Three samples of the second comparison embodiment are made, each being provided with the first transparent conductive layer and the amorphous silicon conductive layer as mentioned above. In the first sample, a back electrode composed of ITO (700 Å) alone is applied in a manner similar to that for forming the second transparent conductive film in the first preferred embodiment. In the second sample, a second transparent conductive film of ITO (700 Å) is applied in the same manner as above and thereafter there is additionally formed thereon a silver film having a thickness of 1 micron by means of electron beam vapor deposition, such that the back electrode of the solar battery comprises ITO and silver. In the third sample, a back electrode of aluminum 1 micron in thickness is applied in a manner similar to that for forming the back electrode in the first comparison embodiment. In each of the samples, a solar battery is produced having dimensions of 2 mm×2 mm.

For the solar battery with a back electrode composed only of ITO, $J_{sc}=13.8$ mA/cm$^2$, $V_{oc}=0.84$ V (as shown by curve E in FIG. 4), and $\eta=6.8\%$. For the solar battery with a back electrode comprising ITO and silver, $J_{sc}=15.6$ mA/cm$^2$, $V_{oc}=0.84$ V (as shown by curve F in FIG. 4), and $\eta=8.8\%$. For the solar battery in which the rear surface electrode comprises only aluminum, $J_{sc}=14.7$ mA/cm$^2$, $V_{oc}=0.84$ V (as shown by curve G in FIG. 4) and $\eta=8\%$.

PREFERRED EMBODIMENT IV

For the fourth preferred embodiment, InCl$_4$.4H$_2$O and SnCl$_4$.4H$_2$O are measured such that the amount of tin is 2% by weight in relation to the amount of indium. The materials thus measured are dissolved in a hydrochloric acid aqueous solution of 1% so as to be 10 wt. % thereof, whereby there is prepared an ITO material in liquid form.

This ITO material liquid is sprayed on a glass substrate which has been heated to 470° C. In this way, several samples having a first transparent conductive film made of ITO and having a thickness of 0.2, 0.4, 0.6, 0.8, 1.0, and 1.6 microns, respectively, are prepared. The surfaces of these first transparent conductive films have respective average grain diameters of 0.1, 0.2, 0.3, 0.4, 0.5, and 0.9 micron and respective sheet resistances of 18, 11, 7, 5, 4, and 3 ohms/square.

In a manner similar to that used for the first preferred embodiment, amorphous silicon semi-conductor layers are deposited on the respective first transparent conductive layer of these samples and then back electrodes are formed thereon by applying second transparent conductive films made of ITO alone, each being 700 Å in thickness, whereby the respective solar batteries are produced. These solar batteries have short-circuit current densities $J_{sc}$ in the range 14.9–18.9 mA/cm$^2$, as shown by curve H in FIG. 5.

PREFERRED EMBODIMENT V

As was done in the case of the fourth preferred embodiment, first transparent conductive films having an average grain diameter on the surface in the range 0.1–0.9 micron, amorphous silicon semi-conductor layers, and second transparent conductive films (ITO) are formed on respective glass substrates, in sequence, to obtain respective samples. Thereafter, a 1-micron-thick silver film is applied on each sample by electron beam vapor deposition. The result is solar batteries having dimensions of 2 mm×2 mm and having a back electrode comprising respective layers of ITO and silver.

Figure 5:
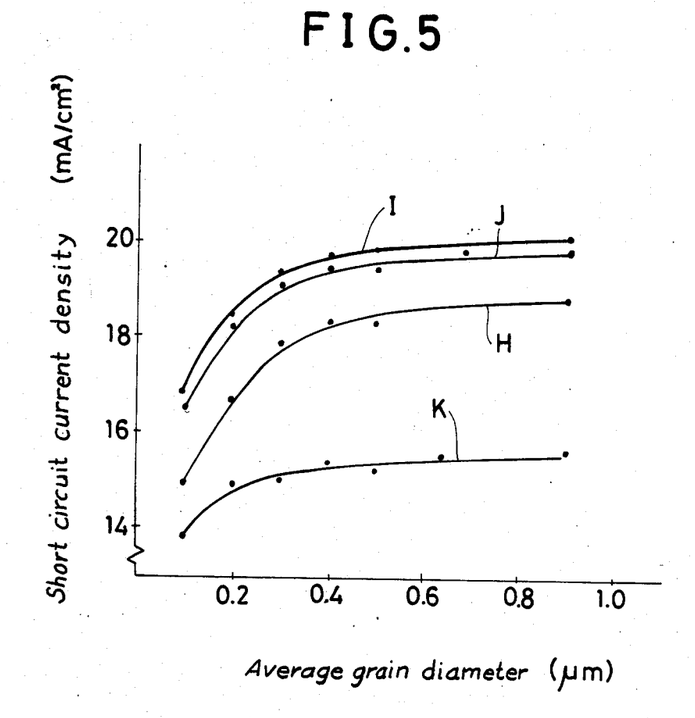
FIG. 5 is a diagram showing the short-circuit current density in relation to average grain diameter of the first transparent conductive film of the three preferred embodiments of the present invention (H-J) and a comparison embodiment (K).

The short-circuit current densities $J_{sc}$ of these solar batteries, when tested with a solar simulator of AM-1 at 100 mW/cm$^2$, lie in the range of 16.7–20.2 mA/cm$^2$, as shown by curve I in FIG. 5.

PREFERRED EMBODIMENT VI

In a manner similar to that used for the fourth preferred embodiment, first transparent conductive films (ITO) and amorphous silicon semi-conductor layers are formed on glass substrates, in sequence, to obtain respective samples. Thereafter, in a manner similar to that used in the third preferred embodiment, each sample is prepared such that a back electrode comprising respective layers of ITO and aluminum are formed on the semi-conductor layer. In this way solar batteries having dimensions of 2 mm×2 mm are produced. The short-circuit current densities $J_{sc}$ of these solar batteries lie in the range of 16.1–20 mA/cm$^2$, as shown by curve J in FIG. 5.

COMPARISON EMBODIMENT III

For the purpose of comparison, an embodiment is prepared in a manner similar to that used for the fourth preferred embodiment, wherein amorphous silicon semi-conductor layers are deposited on the respective first transparent conductive films for which the various average grain diameters on the surface are the same as above. Then in a manner similar to that used for the first comparison embodiment, back electrodes of aluminum are formed on the semi-conductor layers to obtain solar batteries, each being 2 mm×2 mm square. The short-circuit current densities $J_{sc}$ of these solar batteries lie in the range of 13.9–15.7 mA/cm$^2$, as shown by curve K in FIG. 5.

According to the first preferred embodiment and the first comparison embodiment, as is clear from FIG. 3, for the solar batteries in which the average grain diameter of the surfaces of the first transparent conductive films is 0.4 micron, the short-circuit current density for the case where the back electrode is composed only of the second transparent conductive film is about 20% greater than that for the case where the back electrode is composed only of aluminum. Furthermore, the short-circuit current density for the case where the back electrode is composed of the second transparent conductive film and the aluminum film is about 27% greater than that for the case where the back electrode is composed only of aluminum.

Figure 4:
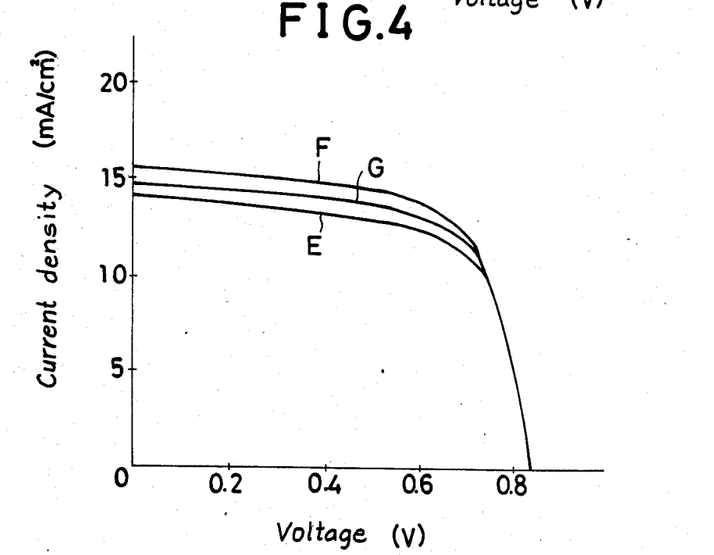
FIG. 4 is a voltage-current density characteristic diagram for three embodiments of a conventional solar battery (E-G)

On the other hand, according to the second comparison embodiment, as is clear from FIG. 4, for the solar batteries in which the average grain diameter of the surfaces of the first transparent conductive films is 0.04 micron, the short-circuit density for the case where the back electrode is composed of the second transparent conductive film with or without the silver film is as low as that for the case where the back electrode is composed only of the aluminum film.

From the foregoing results it can be concluded that the reflection effect of the second transparent conductive film becomes large if a first transparent conductive film is used in which the average grain diameter of the surface is greater than 0.1 micron, and the reflection effect becomes small if a first transparent conductive film is used in which the average grain diameter of the surface is 0.04 micron.

As is clear from FIG. 2, for those solar batteries in which the first transparent conductive films have an average grain diameter greater than 0.1 micron, the battery wherein the back electrode is composed only of the second transparent conductive film has a larger reflective effect than the battery wherein the back electrode is composed only of aluminum. Consequently, the short-circuit current density of the former is increased in the range of 7–34% as compared with the latter. Additionally, for the battery wherein the back electrode is composed of the second transparent conductive film and the aluminum film, the current density is further increased 19–41% as compared with the battery where the back electrode is composed of aluminum alone.

PREFERRED EMBODIMENT VII

A first transparent conductive film (ITO) having a thickness of 1 micron is formed on a glass substrate by a spray process, and the film has an uneven surface with average grain diameter of 0.4 micron, and the sheet resistance thereof is 5 ohms/square. By a glow discharge process, an amorphous silicon semi-conductor layer is formed on this ITO film so as to comprise a p layer, an i layer, and an n layer, in sequence, with respective thicknesses of 150 Å, 5000 Å, and 300 Å. Finally, by a vacuum vapor deposition process, a second transparent conductive film (ITO) having a thickness of 800 Å is formed as a back electrode on that semi-conductor layer. The resultant solar battery when irradiated by a solar simulator of AM-1 has the voltage-current density characteristic shown by curve L in FIG. 6. This results in a short-circuit current density $J_{sc}$ equal to 18 mA/cm$^2$.

PREFERRED EMBODIMENT VIII

In a manner similar to that used in making the seventh preferred embodiment, a first transparent conductive film (ITO) and an amorphous silicon semi-conductor layer are formed in sequence on a glass substrate, and as a back electrode, first a second transparent conductive film (ITO) 800 Å in thickness, and, secondly, a silver film 1 micron in thickness are formed on the amorphous silicon semiconductor layer by a vacuum vapor deposition process. The resultant solar battery has the voltage-current density characteristic shown by curve M in FIG. 6. This results in a short-circuit current density $J_{sc}$ equal to 19.3 mA/cm$^2$. Also the spectral sensitivity characteristic (short-circuit current density characteristic in relation to wavelength of solar light) is shown by curve M in FIG. 7.

COMPARISON EMBODIMENT IV

In a manner similar to that used in making the seventh preferred embodiment, a transparent conductive film (ITO) and an amorphous silicon semi-conductor layer are formed in sequence on a glass substrate, and thereafter an aluminum film 1 micron in thickness as a back electrode is formed thereon by a vacuum vapor deposition process.

Figure 6:
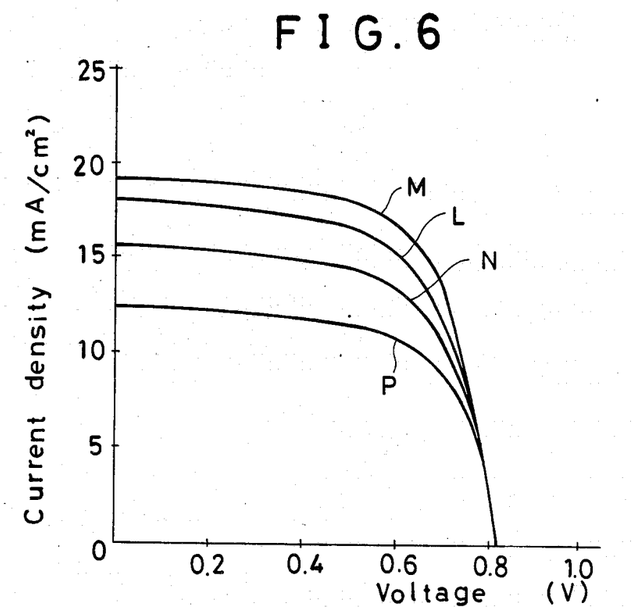
FIG. 6 is a voltage-current density characteristic diagram for preferred embodiments of the present invention (L, M) and comparison embodiments (N, P)

The resultant solar battery has the voltage-current density characteristic shown by curve N in FIG. 6. This results in a short-circuit current density $T_{sc}$ equal to 15.5 mA/cm$^2$.

COMPARISON EMBODIMENT V

By a spray process, a first transparent conductive film (ITO) of about 1000 Å in thickness is formed on a glass substrate, and this ITO film has an uneven surface with an average grain diameter of 0.05 micron and the sheet resistance thereof is 20 ohms/square.

In a manner similar to that used in making the seventh preferred embodiment, an amorphous silicon conductor layer is formed on the ITO film so as to comprise a p layer, an i layer, and a n layer in sequence, and in succession thereto, first a second transparent conductive film (ITO) of about 500 Å in thickness is formed thereon and then a chromium film of about 1 micron in thickness is formed as a back electrode by an electron beam evaporation process. The resultant solar battery has the voltage-current density characteristic shown by curve P in FIG. 6. This results in a short-circuit current density equal to 12.5 mA/cm$^2$. Also the spectral sensitivity characteristic thereof is shown by curve P in FIG. 7.

COMPARISON EMBODIMENT VI

A comparison solar battery VI of Deckmann et al type is provided as shown in FIG. 8, with a glass substrate a having an uneven surface comprising a number of semispherical concavities and convexities, and a silver film b of about 0.2 micron in thickness and a transparent conductive film (ITO) c of about 500 Å in thickness are formed on the uneven surface of the glass substrate a in sequence, and thereafter an amorphous silicon conductor layer d having a textured surface is formed on the ITO film c so as to comprise a p layer, an i layer, and an n layer in sequence having respective thicknesses of 150 Å, 5000 Å, and 300 Å, and finally a transparent film (ITO) e of about 700 Å in thickness is formed by an electron beam vapor deposition process.

Figure 10:
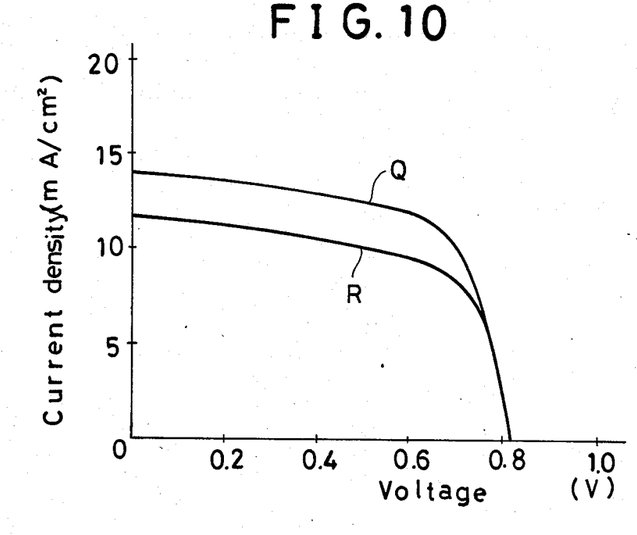
FIG. 10 is a voltage-current density characteristic diagram for comparison embodiments (Q, R) of the conventional batteries in FIGS. 8 and 9.

The resultant solar battery VI has the voltage-current density characteristic shown by curve Q in FIG. 10. This results in a short-circuit current density equal to 14 mA/cm$^2$.

COMPARISON EMBODIMENT VII

Figure 9:
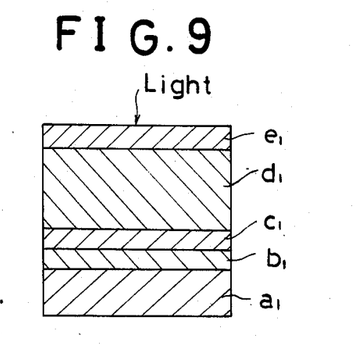
FIG. 9 is a sectional view of part of a modified one of the conventional amorphous silicon solar battery shown in FIG. 8.

A comparison solar battery VII is provided as shown in FIG. 9, with a glass substrate $a_1$ having a flat surface, and a chromium film $b_1$ of about 0.5 micron in thickness and a transparent conductive film (ITO) $c_1$ of about 500 Å in thickness are formed on the flat surface of the glass substrate $a_1$ in sequence, by an electron beam vapor deposition process and thereafter an amorphous silicon conductor layer $d_1$ having a flat surface is formed on the ITO film so as to comprise a p layer, an i layer, and an n layer in sequence having respective thicknesses of 150 Å, 5000 Å, and 300 Å, and finally, by an electron beam vapor deposition process, a transparent conductive film (ITO) $e_1$, of about 700 Å in thickness is formed thereon. The resultant solar battery VII has the voltage-current density characteristic shown by curve R in FIG. 10. This results in a short-circuit current equal to 11.8 mA/cm$^2$. The spectral sensitivity characteristics of the comparison embodiments VI and VII are shown by respective curves Q and R in FIG. 11.

Figure 7:
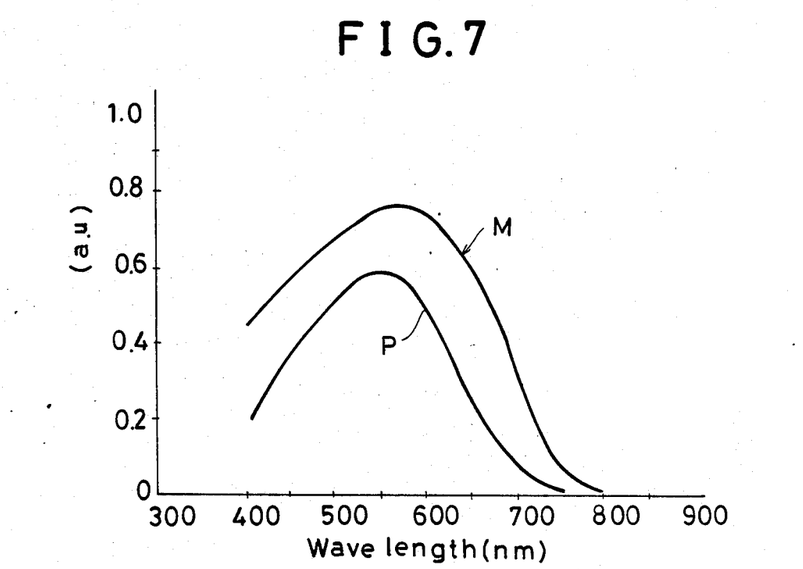
FIG. 7 is a spectral sensitivity characteristic diagram for a preferred embodiment (M) and a comparison embodiment (P)
Figure 11:
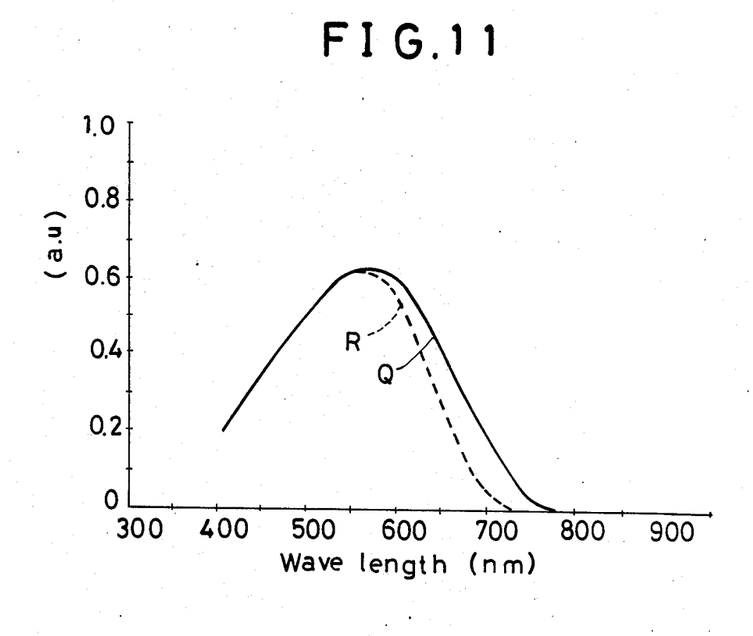
FIG. 11 is a spectral sensitivity characteristic diagram for comparison embodiments of the conventional ones.

The characteristic curves P,M,Q,R in FIG. 7 and FIG. 11 are the measured results obtained by using a spectral sensitivity measuring apparatus made by Japan Spectroscopic Co. Ltd. The unit of spectral sensitivity in FIG. 7 and FIG. 11 is an arbitrary unit (a.u.).

When the preferred embodiment VII of this invention is compared with the comparison embodiment IV, it is clear that, in a case where the average grain diameter of the surface of the ITO film as a first transparent conductive film is the same, such as 0.4 micron in those solar batteries, the short-circuit current density of the solar battery in which the back electrode comprises ITO films alone is about 16% larger than that of the solar battery in which the back electrode comprises an aluminum film alone as shown by curves L and N in FIG. 6.

In addition, when the preferred embodiment VIII of this invention is compared with the comparison embodiment IV, it is clear that the short-circuit current density of the solar battery in which the back electrode comprises the ITO film and the silver film is about 24% larger than that of the solar battery in which the back electrode comprises aluminum film, as shown by curves M and N in FIG. 6.

Further, when the preferred embodiment VIII is compared with the comparison embodiment V, it is clear that in the cases where the back electrode comprises an ITO film and a silver film and the back electrode comprises an ITO film and a chromium film, respectively, the short-circuit current density of the solar battery in which the average grain diameter of the surface of the ITO film is 0.4 micron is about 54% larger than that of the solar battery in which the average grain diameter of the surface of the ITO film is 0.05 micron as shown by curves M and P in FIG. 6, and the spectral sensitivity of the former is much improved in the wide range of the wavelength of the solar light as compared with that of the latter, as shown by curves M and P in FIG. 7.

When the preferred embodiment VII is compared with the comparison embodiments VI and VII, the short-circuit current density of the preferred embodiment VII is about 28% larger than that of the comparison embodiment VI and about 46% larger than that of the comparison embodiment VII, as shown by curve L in FIG. 6 and by curves Q and R in FIG. 10, and in addition the spectral sensitivity of the preferred embodiment VIII is much improved over the wide range of the wavelength of the solar light as compared with those comparison embodiments VI and VII as shown by curve M in FIG. 7 and by curves R and Q in FIG. 11.

Thus, according to the present invention, a first transparent conductive film is formed such that its surface roughness as measured by average grain diameters in the range of 0.1–0.9 micron, and in addition, a back electrode comprising at least a second transparent conductive film is formed so that an improvement in short-circuit current density of the solar battery can be achieved over a wide range of the wavelength of a solar light.

The foregoing description of the preferred embodiments is presented for illustrative purposes only and is not intended to limit the scope of the present invention as recited in the appended claims. Modifications may be readily effected by one having ordinary skill in the art without departing from the spirit and scope of the inventive concept herein disclosed.

What is claimed is:

1. An amorphous silicon solar battery of the type comprising a transparent substrate, a transparent electrode formed on said substrate, an amorphous silicon semi-conductor layer formed on said transparent electrode, and a back electrode formed on said semi-conductor layer, wherein said transparent electrode comprises a first transparent conductive film with an uneven surface formed by particles having an average grain diameter in the range of 0.1–0.9 micron, and said back electrode comprises at least a second transparent conductive film.

2. An amorphous silicon solar battery as defined in claim 1, wherein said back electrode comprises said second transparent conductive film and a metallic film formed thereon.

3. An amorphous silicon solar battery as defined in claim 2, wherein said second transparent conductive film is an indium tin oxide film.

4. An amorphous silicon solar battery as defined in claim 2, wherein said metallic film is composed of a metal selected from the group consisting of silver, aluminum, copper, and chromium.

5. An amorphous silicon solar battery as defined in claim 1, wherein said first transparent conductive layer is a tin oxide film.

6. An amorphous silicon solar battery as defined in claim 1, wherein said first transparent conductive film is an indium tin oxide film.

7. An amorphous silicon solar battery as defined in claim 1, wherein said second transparent conductive film is an indium tin oxide film.

* * * * *